(12) United States Patent
Fuhrmann et al.

(10) Patent No.: US 7,197,679 B2
(45) Date of Patent: Mar. 27, 2007

(54) METHOD FOR TESTING AN INTEGRATED SEMICONDUCTOR MEMORY WITH A SHORTENED READING TIME

(75) Inventors: Dirk Fuhrmann, Essex Junction, VT (US); Reidar Lindstedt, München (DE)

(73) Assignee: Infineon Technologies AG, Munich (DE)

( * ) Notice: Subject to any disclaimer, the term of this patent is extended or adjusted under 35 U.S.C. 154(b) by 172 days.

(21) Appl. No.: 11/095,670

(22) Filed: Apr. 1, 2005

(65) Prior Publication Data

US 2005/0222796 A1    Oct. 6, 2005

(30) Foreign Application Priority Data

Apr. 2, 2004    (DE)    ............ 10 2004 016 334

(51) Int. Cl.
*G11C 29/00*    (2006.01)

(52) U.S. Cl. ........................ 714/719; 714/742
(58) Field of Classification Search ........... 365/203, 365/194, 223, 221, 201; 714/718, 719
See application file for complete search history.

(56) References Cited

U.S. PATENT DOCUMENTS

| | | | |
|---|---|---|---|
| 5,432,747 A * | 7/1995 | Fuller et al. ............ 365/203 |
| 5,548,560 A | 8/1996 | Stephens, Jr. et al. |
| 5,615,169 A | 3/1997 | Leung |
| 5,708,624 A | 1/1998 | Leung |
| 5,875,135 A * | 2/1999 | Patwardhan et al. ........ 365/194 |
| 6,385,125 B1 * | 5/2002 | Ooishi et al. ............... 365/233 |
| 6,477,101 B2 * | 11/2002 | Cavaleri et al. ............ 365/221 |
| 6,532,184 B2 | 3/2003 | Chun |
| 6,643,218 B1 | 11/2003 | Chun |
| 6,963,514 B2 * | 11/2005 | Lindstedt et al. ........... 365/201 |

OTHER PUBLICATIONS

HYB25D266[400/800/160]B[T/C](L) 256-Mbit, Double Rata Data SDRAM, Die Rev. B.; Data Sheet, Jan. 2003, V1.1.

* cited by examiner

*Primary Examiner*—David Ton
(74) *Attorney, Agent, or Firm*—Edell, Shapiro & Finnan, LLC (57)    ABSTRACT

An integrated semiconductor memory operates in synchronization with a clock signal in a normal operating state and is switched from the normal operating state to a test operating state by applying a combination of control signals. During a first test cycle, selection transistors for memory cells are turned on by asynchronously actuating the semiconductor memory using a state change in a control signal. In a second test cycle, the memory content of at least one of the previously activated memory cells is read by synchronously actuating the semiconductor memory using a second signal combination of control signals. By shifting the timing of a signal edge which prompts the state change in the first test cycle close to the time at which the second signal combination is applied in the second test cycle, it is possible to test short reading times which are within one period of the clock signal.

13 Claims, 3 Drawing Sheets

METHOD FOR TESTING AN INTEGRATED SEMICONDUCTOR MEMORY WITH A SHORTENED READING TIME

CROSS REFERENCE TO RELATED APPLICATIONS

This application claims priority under 35 U.S.C. § 119 to German Application No. DE 102004016334.0, filed on Apr. 2, 2004, and titled "Method for Testing an Integrated Semiconductor Memory, and Integrated Semiconductor Memory," the entire contents of which are hereby incorporated by reference.

FIELD OF THE INVENTION

The invention relates to a method for testing an integrated semiconductor memory.

BACKGROUND

An integrated semiconductor memory, for example a DRAM (Dynamic Random Access Memory) semiconductor memory, comprises memory cells arranged in a memory cell array, constructed from rows and columns in a matrix form, between word lines and bit lines. A single DRAM memory cell comprises a storage capacitor which can be connected to one of the bit lines by a selection transistor. A control connection on the selection transistor is connected to one of the word lines. For read or write access to the DRAM memory cell, the selection transistor is turned on by actuating an appropriate control signal on the word line, so that the storage capacitor is connected to the bit line via the activated path of the selection transistor. Depending on the charge state of the storage capacitor corresponding to a logic information item stored in the memory cell, the bit line's potential rises or falls in comparison with a precharge potential to which the bit lines in the memory cell array have been charged, generally prior to read or write access. A sense amplifier connected to the bit line amplifies the generally small potential change on the bit line to produce a high or low voltage potential.

To control read and write access, the integrated semiconductor memory comprises control connections, address connections, and data connections. Various control signals applied to the control connections of the integrated semiconductor memory can be used to activate the integrated semiconductor memory for read access, for example. Address signals applied to the address connections of the integrated semiconductor memory can in this case be used to select a particular memory cell for read access. Following the read access, the data stored in the selected memory cell are available on the data connections for further processing.

Figure 1:
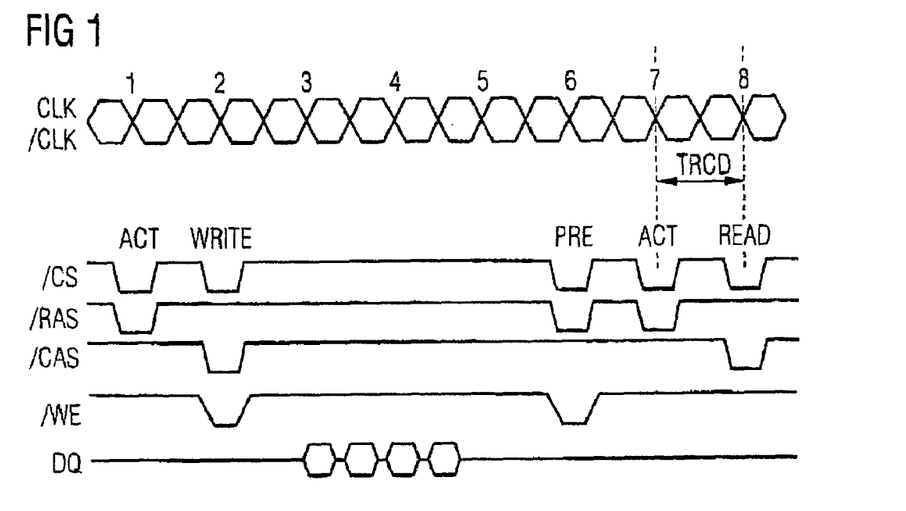
FIG. 1 shows a signal state diagram for read and write access to an integrated semiconductor memory.

FIG. 1 shows a state diagram for read and write access to one of the memory cells in a memory cell array. The figure shows the time profile for control signals /CS, /RAS, /CAS and /WE and for data signals DQ, applied to the control connections and data connections of the integrated semiconductor memory during a plurality of clock periods of the control clock signals CLK and /CLK.

During a first clock cycle of the control clock, the integrated semiconductor memory is activated for write access. To this end, a signal combination ACT, which is formed from respective pulses of the control signals /CS and / RAS, is applied to the control connections of the integrated semiconductor memory. Further, the signal combination ACT is characterized by a state change in the control signal / CS and in the control signal /RAS from a high signal level to a low signal level at the crossover point for the control clocks CLK and /CLK. At the end of the first clock cycle, the control signals /CS and /RAS change back from the low signal level to the high signal level. The selection transistors for memory cells in one row of the memory cell array are conductively connected to the connected bit lines at the end of this first clock cycle.

During a second clock cycle of the control clock, the signal combination WRITE, which is formed from combinations of states of the control signals /CS, /CAS and /WE, is applied to the control connections of the integrated semiconductor memory. At the crossover point for the control clocks CLK and /CLK, the control signals /CS, /CAS and /WE change state from a high signal level to a low signal level. At the end of the second clock cycle, the control signals change back from the low signal level to the high signal level. The effect of the signal combination WRITE is that, among the selection transistors which are on in the memory cells in one row of the memory cell array, only that selection transistor which is associated with one particular column is conductively connected to the associated bit line. The other selection transistors are turned off.

During a subsequent third, fourth and fifth clock cycle of the control clock, a data record DQ applied to the data connections is read into the selected memory cell.

During a subsequent sixth clock cycle of the control clock, the signal combination PRE formed from respective pulses of the control signals /CS, /RAS and /WE is applied to the control connections of the integrated semiconductor memory. At the crossover point of the control clocks CLK and /CLK, the control signals /CS, /RAS and /WE change state from a high signal level to a low signal level. At the end of the sixth clock cycle, the control signals change back from the low signal level to the high signal level. The signal combination PRE charges the bit lines of the memory cell array to a common precharge potential which is between a high voltage potential, corresponding to a (logic 1) and a low voltage potential (logic 0). The aim of precharging the bit lines to a common precharge potential is to prevent signal levels from an earlier read or write access operation which are present on the bit lines from influencing a subsequent read or write access operation.

In the next seventh clock cycle of the control clock, the selection transistors for memory cells in one row of the memory cell array are turned on again by the signal combination ACT.

During a subsequent eighth clock cycle of the control clock, the signal combination READ, which is formed from pulsed state changes in the control signals /CS and /CAS, is applied to the control connections of the integrated semiconductor memory. At the crossover point of the control clocks CLK and /CLK, the control signals /CS and /CAS change state from a high signal level to a low signal level. At the end of the eighth clock cycle, the control signals change back from the low signal level to the high signal level. Among the selection transistors which are on in one row of the memory cell array, the signal combination READ now turns on a selection transistor which is associated with a particular column address. The other selection transistors in the selected row are operated in the off state. The sense amplifier connected to the selected memory cell amplifies the rise in potential or fall in potential which has appeared on the bit line to produce a high or a low voltage level, respectively. The memory information which has been read out, is then supplied to a data connection and can be tapped off at that point for further processing.

The interval of time between turning on a selection transistor in the memory cell array, for example using the signal combination ACT during the seventh clock cycle, and a subsequent read command, for example using the signal combination READ during the eighth clock cycle, determines a "reading time" TRCD for the integrated semiconductor memory. The reading time TRCD, which is generally part of the specification of the integrated semiconductor memory, is a particularly critical time parameter for the speed of a semiconductor memory. The reading time TRCD required for read access has been reduced further and further in recent years as technological development has progressed. To ensure the reading time indicated in the specification, this time parameter is tested in various tests during the manufacturing process at wafer level and on the finished component when production has been concluded. The reading times which can be produced are now already below 12 ns in some cases. The circuit design alone can no longer guarantee such short times, since the reading times are highly dependent on process fluctuations. It is therefore absolutely necessary to test the reading times, especially since the production process still has the option of replacing memory cells in a semiconductor memory which infringe the prescribed time limit with redundant memory cells. However, conventional tester limitations, for example, speed restrictions, mean that present test systems often have only limited ability to continue reliable testing of the reading times which are becoming shorter and shorter from memory generation to memory generation.

SUMMARY OF THE INVENTION

The invention provides a method which allows reliable testing of short reading times during the manufacture of an integrated semiconductor memory at wafer level and following production of an integrated semiconductor memory at component level. Further, the invention provides an integrated semiconductor memory which allows reliable testing of short reading times largely independently of performance restrictions in existing test systems.

According to the invention, a method for testing an integrated semiconductor memory includes the following operations. An integrated semiconductor memory is provided that can be operated in synchronization with a clock signal in a normal operating state and can be operated in or out of synchronization with the clock signal in a test operating state and which has memory cells which can each be used to store a data item. A data item is read into at least one of the memory cells in the normal operating state of the integrated semiconductor memory. The integrated semiconductor memory is switched from the normal operating state to the test operating state by a control circuit when the control circuit is actuated using a first signal combination formed from control signals, address signals, and data signals. A selection transistor for at least one of the memory cells is turned on by the control circuit in a first test cycle when the control circuit is actuated using a state change in one of the control signals, the state change in the control signal taking place out of sync with the clock signal. The memory content of the at least one of the memory cells is subsequently read by the control circuit in a second test cycle by actuating the control circuit using a second signal combination formed from the control signals.

By virtue of the state change in one of the control signals being interpreted by the control circuit as a command signal for turning on the selection transistors, and this state change being able to take place at arbitrary times, it is possible for integrated semiconductor memories which are operated in sync with a clock signal in the normal operating state, "SDRAMs" (Synchronous Dynamic Random Access Memories), to be operated out of sync with this clock signal in the test operating state.

A data record can be read into the memory cells of the integrated semiconductor memory before the integrated semiconductor memory is switched to the test operating state. This data record needs to be read correctly using the set reading time when testing the integrated semiconductor memory. To this end, during testing, the reading time is set to be shorter than the reading time which is to be specified. If the data record is read incorrectly, the semiconductor memory does not meet the specification. Since the test method can be applied at wafer level, the memory cell in question can be replaced with a redundant memory cell which may be present.

In one embodiment of the inventive method for testing an integrated semiconductor memory, the control circuit is actuated in the first test cycle using the state change in one of the control signals, and the control circuit is subsequently actuated in the second test cycle using a second signal combination formed from the control signals, the interval of time between the state change in the control signal and the second signal combination comprising the control signals being shorter than one clock period of the clock signal.

In this embodiment of the method, it is thus possible to shorten reading times, which comprise at least one clock period in the normal operating state. This means that it is possible to test reading times of very short duration, for example, below the duration of one clock period of the clock signal.

In a further embodiment of the method, the control circuit is actuated in the second test cycle using a second signal combination, formed from the control signals, for the purpose of reading at least one of the memory cells, the control circuit being actuated using the second signal combination in sync with the clock signal. When two clock signals are used, with the timing of the first clock signal being complementary to that of the second clock signal, the end time of the reading time is at a crossover point for the timing of the two clock signals. This end time represents a fixed time stamp as a result of being tied to the profile of the clock signal. The start time, which is determined out of sync with the clock signal as a result of the state change in one of the control signals, can be defined variably, independently of the clock signal. Its timing can therefore be shifted so as to be very close to the reading time's end time, which allows short reading times to be tested.

In a further aspect of the method for testing an integrated semiconductor memory, the control circuit produces a first internal control signal for turning on the selection transistor, as a result of the state change in one of the control signals. In order to read the memory content of the at least one of the memory cells at the data connection, the control circuit produces a second internal control signal, as a result of the second signal combination formed from the control signals.

In another embodiment of the inventive method, the first internal control signal and the second internal control signal are produced at intervals of time which are shorter than one clock period of the clock signal.

In another refinement of the method for testing an integrated semiconductor memory, the control circuit is actuated in the first test cycle using a third signal combination formed from the control signals. In the test operating state, the third signal combination involves one of the control signals having a signal edge out of sync with the clock signal in the integrated semiconductor memory, and the signal edge of the control signal prompting the state change in the control signal. This state change is used by the control circuit to turn on the selection transistor for one of the memory cells.

To start the first test cycle in the integrated semiconductor memory, the control circuit can be actuated using a fourth signal combination formed from the control signals. As soon as the control circuit is actuated using this signal combination in the test operating state, its control connections accept a change in the signal sequence as compared with the test operating state.

In one preferred embodiment of the method for testing an integrated semiconductor memory, the bit lines are precharged by the control circuit to a common voltage potential between a high voltage potential, corresponding to a logic 1 information item, and a low voltage potential, corresponding to a logic 0 information item, as a result of the actuation of the control circuit using the fourth signal combination.

In accordance with a further feature of the inventive method for testing an integrated semiconductor memory, the control circuit is actuated using a fifth signal combination formed from the control signals, which means that the integrated semiconductor memory can be switched back to the normal operating state after the second test cycle.

One particular advantage of the inventive method is that the same control signals can be used for controlling the integrated semiconductor memory in the test operating state as are also used for controlling the integrated semiconductor memory in the normal operating state. Thus, there is no need for any additional control signals or for any additional control connections either. In the normal operating state, the control circuit in the integrated semiconductor memory is actuated using the second signal combination, formed from the control signals, for the purpose of reading one of the memory cells, with the control signals in the second signal combination actuating the control circuit in sync with the clock signal in the normal operating state. In addition, in line with this embodiment of the method, the control circuit is actuated in the normal operating state of the integrated semiconductor memory using the third signal combination, formed from the control signals, for the purpose of activating the integrated semiconductor memory, with the control signals in the third signal combination actuating the control circuit in sync with the clock signal in the normal operating state. The control circuit can be actuated in the normal operating state of the integrated semiconductor memory using the fourth signal combination, formed from the control signals, for the purpose of precharging the bit lines, with the control signals in the fourth signal combination actuating the control circuit in sync with the clock signal in the normal operating state. Finally, the control circuit can be actuated in the normal operating state of the integrated semiconductor memory using a further signal combination, formed from the control signals, for the purpose of writing the logic 0 or 1 information item to one of the memory cells, with the control signals in the further signal combination actuating the control circuit in sync with the clock signal in the normal operating state.

In a further embodiment, the signal level is changed from a first signal level to a second signal level in the first test cycle during the state change in one of the control signals.

According to another aspect of the invention, an integrated semiconductor memory includes control connections for applying control signals, at least one data connection for applying data signals, and address connections for applying address signals. The integrated semiconductor memory contains a memory cell array with memory cells which each comprise a selection transistor and a storage capacitor. In addition, there is a control circuit which allows the integrated semiconductor memory to be operated in sync with a clock signal in the normal operating state and to be operated in or out of sync with the clock signal in the test operating state. The control signals, the data signals and the address signals can be supplied to the input of the control circuit. In addition, the output of the control circuit is connected to the memory cell array. In this case, the control circuit is designed such that actuating the control circuit using a first signal combination formed from the control signals, the data signals and the address signals switches the integrated semiconductor memory to a test operating state. In addition, the control circuit is designed such that actuating the control circuit in the first test cycle of the test operating state using a state change in one of the control signals turns on the respective selection transistors in the memory cells. In this case, the state change takes place out of sync with a clock signal. Furthermore, the control circuit is designed such that actuating the control circuit in the second test cycle of the test operating state using a second signal combination, formed from the control signals, which is applied to the integrated semiconductor memory in sync with the clock signal reads the memory content in at least one of the memory cells.

In a further embodiment, the integrated semiconductor memory has first sense amplifiers and also first bit line pairs, which connect the first sense amplifiers to the memory cells in the memory cell array, and a second bit line pair, which is connected to the data connection via a second sense amplifier. The first bit line pairs can be connected to the second bit line pair by means of the first sense amplifiers respectively connected to the first bit line pairs. The output of the control circuit is connected to control connections on the selection transistors and to control connections on the first sense amplifiers. In this embodiment, the control circuit is designed such that in the first test cycle of the test operating state its output produces a first internal control signal for turning on the selection transistors if one of the control signals supplied to its input has changed state from a first signal level to a second signal level. In addition, the control circuit is designed such that, in the second test cycle of the test operating state, its output produces a second internal control signal, so that one of the first sense amplifiers connects the first bit line pair connected to it to the second bit line pair for the purpose of reading the memory content of one of the memory cells if the second signal combination formed from the control signals is supplied to the input of said memory cell.

The above and still further aspects, features, and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to figures which show exemplary embodiments of the invention and in which.

DETAILED DESCRIPTION

Figure 2:
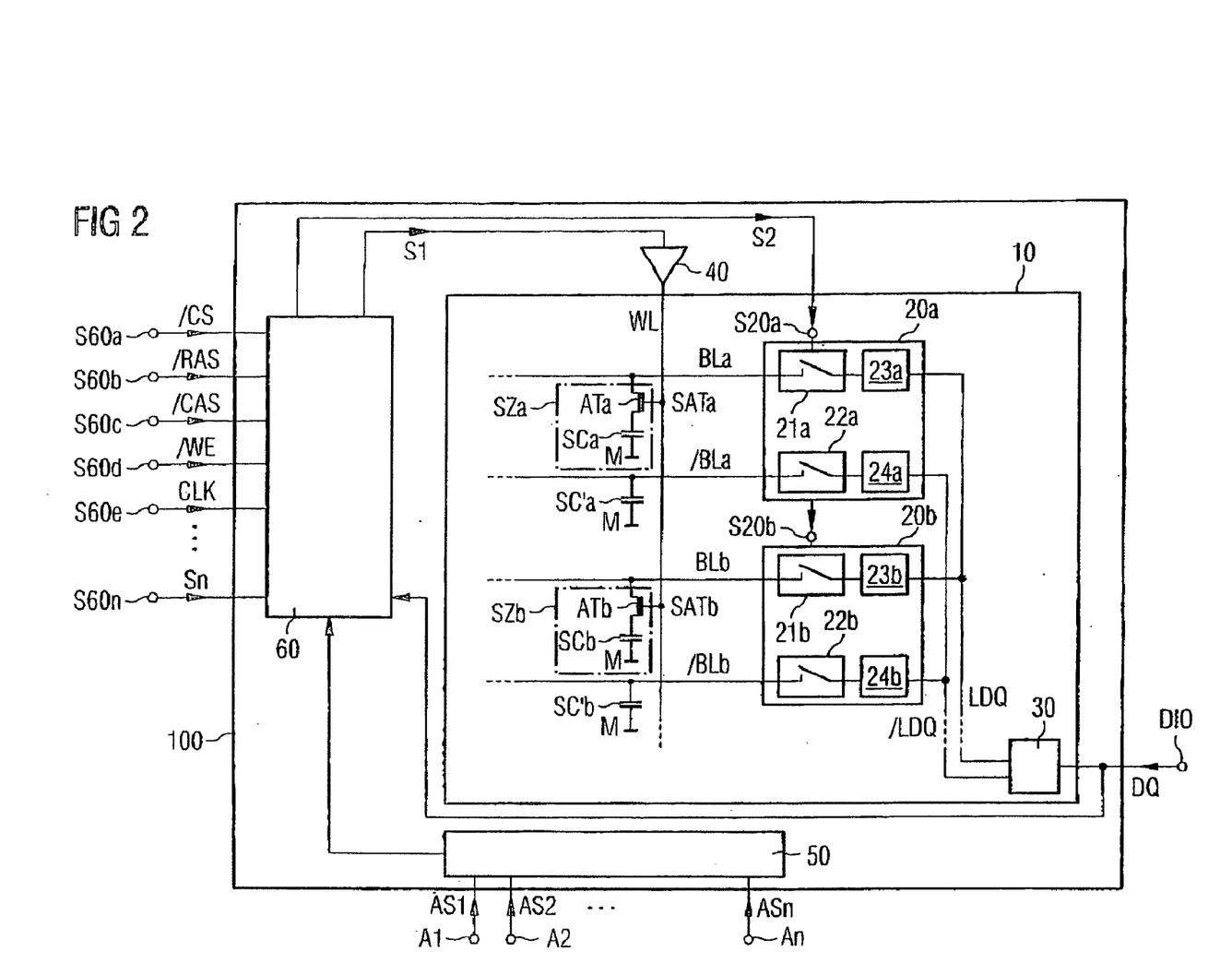
FIG. 2 shows an integrated semiconductor memory for testing the reading time in accordance with an embodiment of the present invention.

FIG. 2 shows an exemplary embodiment of an integrated semiconductor memory 100 for testing the reading times in accordance with an embodiment of the present invention. The integrated semiconductor memory 100 comprises a memory cell array 10, an address register 50 and a control circuit 60. The memory cell array 10 is connected to a data connection DIO for reading data signals DQ in and out. The address register 50 is connected to address connections A1, A2, . . . , An for applying address signals AS1, AS2, . . . , ASn. The control circuit 60 can be actuated by means of control signals /CS, /RAS, /CAS, /WE, CLK and Sn. The control signals are respectively applied to a control connection S60a, S60b, S60c, S60d, S60e, . . . , S60n on the control circuit 60. The control signal CLK, which is applied to the control connection S60e, represents the control clock for the integrated semiconductor memory. In the case of a synchronously operated integrated semiconductor memory, for example an "SDRAM" semiconductor memory, the other control signals actuate the control circuit 60 in sync with the control clock CLK. Besides the control signals, the control circuit 60 may also be supplied with signals which are applied to the data connection DIO. Likewise, the control circuit 60 may be supplied with address signals AS1, AS2, . . . , ASn applied to the address connections via the address register 50. Depending on which control signals, address signals and data signals or signal combinations comprising the control signals, the address signals and the data signals are supplied to it, the control circuit 60 produces internal control signals S1 and S2.

The memory cell array 10 comprises sense amplifiers 20a and 20b which can each be controlled via control connections S20a and S20b. The sense amplifier 20a is connected to a bit line pair comprising the bit lines BLa and /BLa. The bit line BLa is connected to memory cell SZa. The memory cell SZa is in the form of a DRAM memory cell and comprises a selection transistor ATa and a storage capacitor SCa. The storage capacitor SCa is connected to a connection M for applying a reference potential and via the selection transistor ATa to the bit line BLa. The selection transistor ATa can be controlled using a control connection SATa. The bit line /BLa is connected to a storage capacitor SCa'. The bit line /BLa is operated as a bit line which is complementary to the bit line BLa. The sense amplifier 20a comprises a controllable switch 21a and a first amplifier 23a. The controllable switch 21a can be used to connect the first bit line BLa to the first amplifier 23a and via the first amplifier 23a to a local data line LDQ. The sense amplifier 20a also comprises a second controllable switch 22a and a second amplifier 24a. The complementary bit line /BLa can be connected to the second amplifier 24a by means of the second controllable switch 22a, and via said second amplifier to a complementary local data line /LDQ.

The memory cell array 10 also includes a further sense amplifier 20b which is connected to a further memory cell SZb via a bit line BLb and to a storage capacitor SCb' via a bit line /BLb which is complementary to the bit line BLb. The memory cell SCb, which is in the form of a DRAM memory cell, comprises a selection transistor ATb, which can be controlled via a control connection SATb, and a storage capacitor SCb. The sense amplifier 20b comprises a first controllable switch 21b and a first amplifier 23b. The bit line BLb can be connected to the first amplifier 23b by means of the controllable switch 21b, and via the amplifier 23b to the local data line LDQ. The sense amplifier 20b also comprises a second controllable switch 22b and a second amplifier 23b. The bit line /BLb, which is complementary to the bit line BLb, can be connected to the amplifier 24b by means of the controllable switch 22b, and via the amplifier 24b to the complementary local data line /LDQ. The local data line LDQ and its complementary local data line /LDQ are connected to a secondary sense amplifier 30, which is connected to the data connection DIO for the purpose of reading data DQ in and out. The control connections SATa and SATb of the selection transistors are connected to a word line WL. To control the selection transistors, the control circuit 60 produces the internal control signal S1, which is supplied via a word line driver 40 to the control connections SATa and SATb of the selection transistors ATa and ATb. The controllable switches 21a, 22a, 21b, and 22b of the sense amplifiers 20a and 20b can be controlled by means of the internal control signal S2, which is supplied to the control connections S20a of the first sense amplifier 20a and to the control connection S20b of the second sense amplifier 20b. The way in which the circuit components in FIG. 2 work when testing the reading times for the integrated semiconductor memory is discussed below in the description relating to FIGS. 3 and 4.

Figure 3:
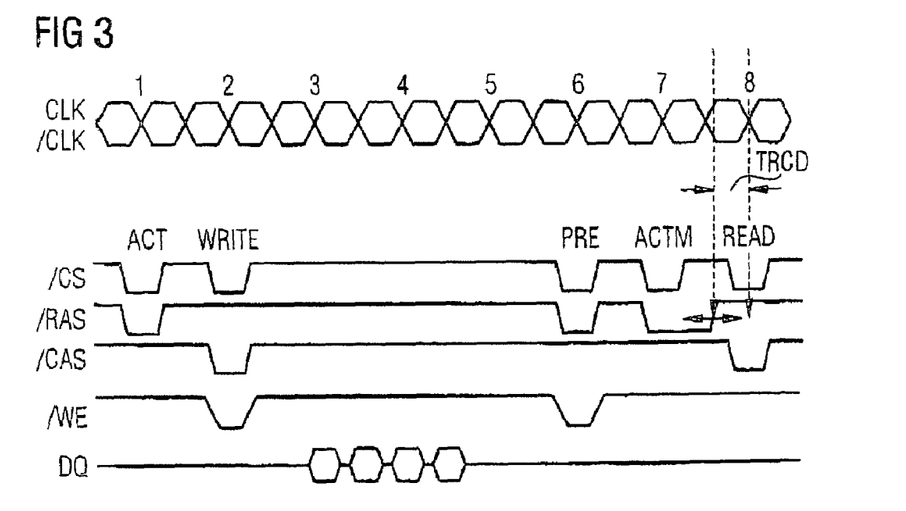
FIG. 3 shows a signal state diagram for testing the reading time in accordance with an embodiment of the present invention.

FIG. 3 shows a signal state diagram for the inventive method for testing the reading times in an integrated semiconductor memory. The figure shows the time sequence of the control signals /CS, /RAS, /CAS and /WE and also of the data signal DQ during eight successive clock cycles of the control clock CLK or /CLK. The signal state diagram corresponds to the signal state diagram already described in FIG. 1, up to the fifth clock cycle of the control clock,. Following actuation of the control circuit 60 using the signal combinations ACT and WRITE, data signals DQ are written to a selected memory cell. For precise description of the individual signal combinations up to the fifth clock cycle, reference is made to the description relating to FIG. 1. After the fifth clock cycle, an arbitrary signal combination comprising data signals, control signals and address signals is applied to the data connection DIO, to the control connections S60a, . . . , S60n and to the address connections A1, . . . , An. This signal sequence is a characteristic signal combination which prompts the control circuit to switch the integrated semiconductor memory to a test operating state for testing the reading times. This may involve, for example, respective state changes in the control signals /CS, /RAS, /CAS and /WE, as illustrated in the signal state diagrams in FIGS. 1 and 3, which are applied to the control connections S60a, S60b, S60c and S60d within one clock cycle. The control circuit 60 is now sensitized for signal sequences which are applied to the control connections, address connections and data connections of the integrated semiconductor memory specifically for the test mode for testing the reading times. In particular, the control circuit 60 now also accepts control, address and data signals applied out of sync with the control clock for the integrated semiconductor memory. In contrast to the normal operating state, the integrated semiconductor memory can be operated both in sync and out of sync in the test operating state.

During the sixth clock cycle, the signal combination PRE already described in FIG. 1 is applied to the control connections of the integrated semiconductor memory. The signal combination PRE has respective state changes in the control signals /CS, /RAS and /WE from a high signal level to a low signal level. The state changes are applied to the control connections of the integrated semiconductor memory in sync with the clock signals CLK and /CLK at the crossover point for the two clock signals. The signal combination PRE precharges the bit lines in order to avoid disturbing influences for a subsequent read access operation on account of voltage levels which still exist on the bit lines. At the end of the sixth clock cycle, the control signals /CS, /RAS and /WE change from the low signal level back to the high signal level.

During the seventh clock cycle, the signal combination ACTM is applied to the control connections; ACTM is representative of a modification of the activation signal ACT during the first clock cycle of the control clock. Just like the signal combination ACT, the signal combination ACTM also comprises state changes in the two control signals /CS and /RAS. However, in contrast to the signal combination ACT, in the case of the signal combination ACTM, the control signals /CS and /RAS are applied to the control connections out of sync with the control clock for the integrated semiconductor memory. In this case, the signal combination ACTM turns on the selection transistors in the memory cells in one row of the memory cell array. However, the selection transistors in question are not turned on at the crossover point for the clock signals CLK and /CLK during the seventh clock cycle, as in the normal operating state with the signal combination ACT, but rather at the time of the rising signal edge of the control signal /RAS. If the control circuit 60 detects the rising edge of the control signal /RAS at the control connection S60*b*, it produces the internal control signal S1, which is used to turn on the selection transistors in the memory cells SZa and SZb. In contrast to the control signal /RAS, the control signal /CS continues to be applied to the control connection S60*a* of the control circuit 60 in sync with the control clock during the signal combination ACTM and changes back from the low signal level to the high signal level at the end of the seventh clock cycle.

During the subsequent eighth clock cycle, the signal combination READ, which is formed from respective state changes in the control signals /CS and /CAS, is applied to the control connections of the integrated semiconductor memory. In this case, the control signals /CS and /CAS actuate the control circuit 60 in sync with the control clock. As soon as the control circuit 60 detects the signal combination READ at the control connections S60*a* and S60*c*, the memory cell associated with a column address is read. The control circuit 60 therefore produces the internal control signal S2 at the crossover point for the two control clocks CLK and /CLK, and supplies it to the control connections S20*a* and S20*b* of the two sense amplifiers 20*a* and 20*b*. That sense amplifier which is connected to the selected memory cell is activated by this control signal. If the column address applied to the address connections selects the memory cell SZa, for example, the two controllable switches 21*a* and 22*a* in the sense amplifier 20*a* are turned on. The controllable switches 21*b* and 22*b* in the sense amplifier 20*b* are operated in the off state. If the memory cell SZa stored a logic 1 information item, for example, then the amplifier 23*a* amplifies the rise in potential on the bit line BLa to produce a high voltage level on the local data line LDQ. On the complementary local data line /LDQ, the sense amplifier 20*a* produces a low voltage level. The secondary sense amplifier 30 compares the two signal levels supplied to it, and its output produces a data signal DQ corresponding to the logic 1 information item. When the memory cell has been read, the test operating state of the integrated semiconductor memory is de-activated again by applying a characteristic signal combination to terminate the test operating state. This may again be an arbitrary signal combination comprising data signals, control signals and address signals. As soon as the control circuit 60 identifies this signal combination, it switches the integrated semiconductor memory back to the normal operating state. The shift in the signal edge of the control signal /RAS during the signal combination ACTM makes it possible to vary the reading time which is to be tested. Since the signal combination READ following the signal combination ACTM always actuates the control circuit 60 in sync with a subsequent control clock, the signal combination READ represents a fixed reference time. If the rising signal edge of the control signal /RAS actuates the control circuit 60 earlier ahead of the signal combination READ, it is possible to extend the reading time which is to be tested. If the timing of the rising signal edge of the control signal /RAS is shifted to be closer to the signal combination READ, it is possible to test shorter reading times.

The fact that the control circuit 60 operates asynchronously in the test operating state means that the interval of time between turning on a selection transistor in a memory cell and reading the corresponding memory cell on the data connection DIO may be shorter than the clock cycle of the control clock. It is thus possible to set or test reading times which are shorter than one clock period of the control clock.

To ensure the reading times indicated in the specification, the reading times to be tested are set to be shorter than their specification in the data sheet. By way of example, if a reading time of 12 ns is indicated in the specification as the time period which is required before data are applied to the data connection DIO after the selection transistor has been turned on, the method described can be used to reduce the time interval between turning on the selection transistor and applying the data to the data connection DIO to 8 ns, for example. If the data record DQ which has been read in during the clock cycles 3, 4 and 5 can be read correctly with the reading time which has been set, the memory cell in question can be regarded as being free of error. If the data record DQ read in previously cannot be read correctly within the time period which has been set, however, then it is possible to deduce that the memory cell is faulty. When the test method is used at wafer level, this memory cell can be replaced with a redundant memory cell.

Figure 4:
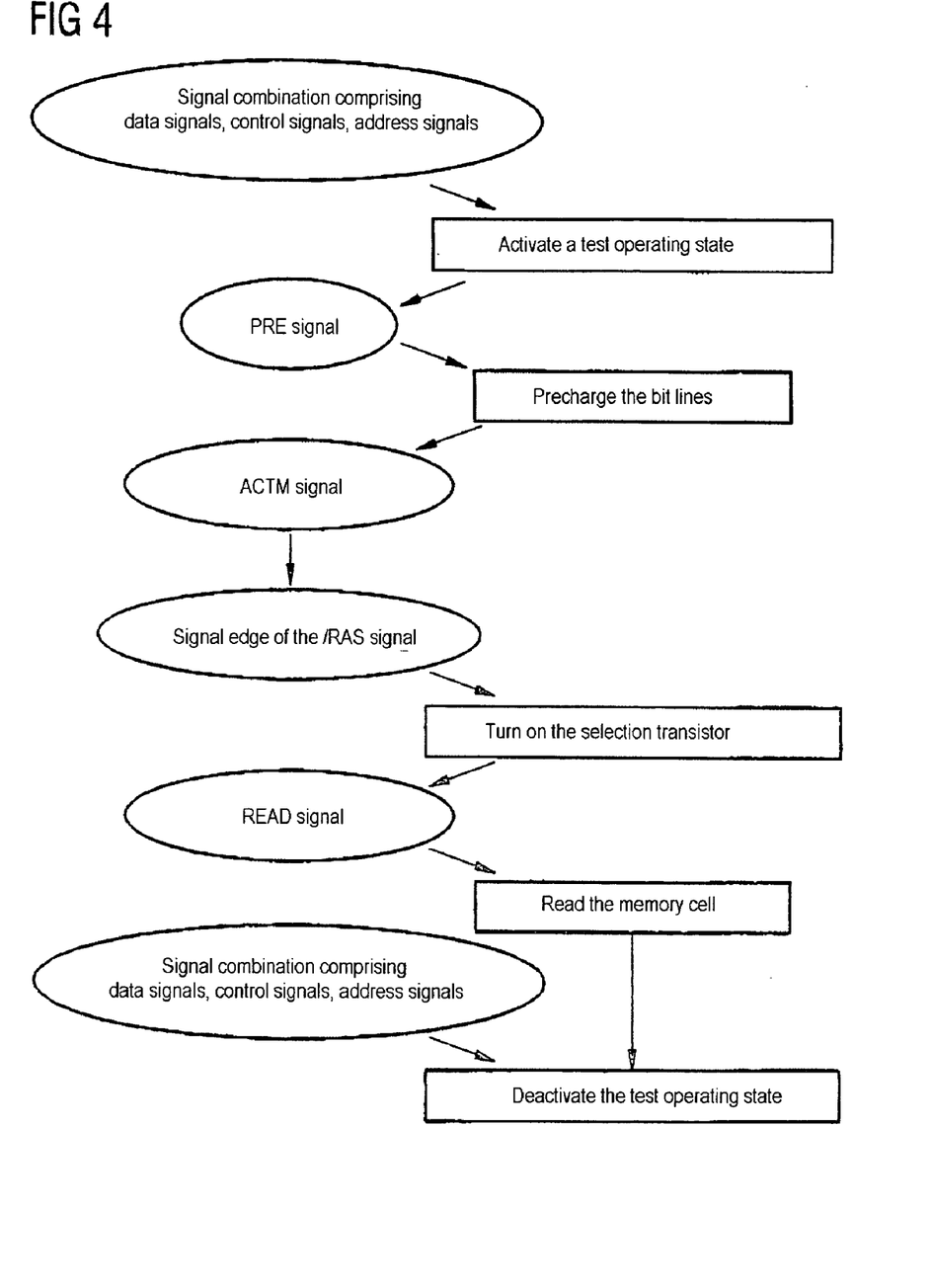
FIG. 4 shows a flowchart for a test method for testing an integrated semiconductor memory in accordance with an embodiment of the present invention.

FIG. 4 shows the method described using the signal state diagram in FIG. 3 for testing the reading times in a flowchart. To activate the test operating state in the integrated semiconductor memory, an arbitrary signal combination comprising data signals, control signals, and address signals is applied to the control connections of the control circuit 60. This sensitizes the control circuit 60 for the signal combinations comprising the control signals which (signal combinations) identify the test operating state. To start the first test cycle in the test operating state, the control circuit 60 is actuated using the signal combination PRE. This precharges the bit lines in the memory cell array to a common precharge potential. Next, the control circuit 60 is actuated using the signal combination ACTM. As soon as the control circuit 60 detects the rising signal edge of the /RAS control signal, the selection transistor in the memory cell, which is to be tested, is turned on. In this context, the selection transistor is turned on out of sync with a control clock for the semiconductor memory. This means that the timing of the operation of turning on the selection transistor can be shifted so as to be close to the subsequent READ signal combination for reading the memory cell at the data connection DIO. The subsequent actuation of the control circuit 60 using a characteristic signal combination comprising data signals, control signals and address signals allows the test operating state of the integrated semiconductor memory to be deactivated again.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Memory cell array
20 Primary sense amplifier
21, 22 Controllable switch
23, 24 Amplifier element
30 Secondary sense amplifier
M Reference potential connection
SAT Control connection on the selection transistor
LDQ Local data line
DQ Data stream
DIO Input/output connection for data
CLK Clock signal
/CS Chip select signal
/RAS Row address strobe signal
/CAS Column address strobe signal
/WE Write enable signal
ACT Signal combination for activating the semiconductor memory
WRITE Signal combination for write access
READ Signal combination for read access
PRE Signal combination for a precharging operation
ACTM Modified activation signal for turning on selection transistors in the test operating state
TRCD Reading time
40 Word line driver
50 Address register
60 Control circuit
100 Integrated semiconductor memory
S60 Control connection of the control circuit
S1, S2 Internal control signals
WL Word line
BL Bit line
AT Selection transistor
SC Storage capacitor
SZ Memory cell

What is claimed is:

1. A method for testing an integrated semiconductor memory, comprising:
providing an integrated semiconductor memory including memory cells each operable to store a data item, the integrated memory cell being operable synchronously with a clock signal in a normal operating state and being operable synchronously or asynchronously with the clock signal in a test operating state;
writing a data item into at least one of the memory cells in the normal operating state;
switching the integrated semiconductor memory from the normal operating state to the test operating state by actuating a control circuit via a first signal combination including control signals, address signals and data signals;
enabling a selection transistor for the at least one of the memory cells in a first test cycle by actuating the control circuit via a state change in one of the control signals, the state change being asynchronous with the clock signal; and
reading the memory content of the at least one of the memory cells in a second test cycle in response to the control circuit being actuated by a second signal combination formed from the control signals.

2. The method for testing an integrated semiconductor memory as claimed in claim 1, further comprising:
actuating the control circuit in the first test cycle using the state change in the one of the control signals; and
actuating the control circuit in the second test cycle using the second signal combination formed from the control signals, wherein the interval of time between the state change in the one of the control signals and the second signal combination is shorter than one clock period of the clock signal.

3. The method for testing an integrated semiconductor memory as claimed in claim 1, further comprising:
actuating the control circuit in a second test cycle via the second signal combination formed from the control signals to read the at least one of the memory cells, the control circuit being actuated using the second signal combination synchronously with the clock signal.

4. The method for testing an integrated semiconductor memory as claimed in claim 1, further comprising:
producing a first internal control signal for enabling the selection transistor via the control circuit in response to the state change in the one of the control signals; and
producing a second internal control signal for reading the memory content of the at least one of the memory cells via the control circuit in response to the second signal combination being formed from the control signals.

5. The method for testing an integrated semiconductor memory as claimed in claim 4, further comprising:
producing the first internal control signal and the second internal control signal at intervals of time which are shorter than one clock period of the clock signal.

6. The method for testing an integrated semiconductor memory as claimed in claim 1, further comprising:
actuating the control circuit in the first test cycle using a third signal combination formed from the control signals, wherein, in the test operating state, the third signal combination involves one of the control signals having a signal edge out of synchronization with the clock signal, the signal edge of the one of the control signals prompting the state change in the one of the control signals, wherein the state change is used by the control circuit to enable the selection transistor.

7. The method for testing an integrated semiconductor memory as claimed in claim 1, further comprising:
actuating the control circuit using a fourth signal combination formed from the control signals to start the first test cycle in the integrated semiconductor memory.

8. The method for testing an integrated-semiconductor memory as claimed in claim 7, further comprising:
precharging bit lines by the control circuit to a common voltage potential between a high voltage potential, corresponding to a logic 1 information item, and a low voltage potential, corresponding to a logic 0 information item, as a result of the actuation of the control circuit using the fourth signal combination.

9. The method for testing an integrated semiconductor memory as claimed in claim 1, further comprising:
actuating the control circuit using a fifth signal combination formed from the control signals to switch the integrated semiconductor memory to the normal operating state after the second test cycle.

10. The method for testing an integrated semiconductor memory as claimed in claim 1, further comprising:
actuating the control circuit in the normal operating state in synchronization with the clock signal using the second signal combination to read one of the memory cells;
actuating the control circuit in the normal operating state in synchronization with the clock signal using a third signal combination formed from the control signals to activate the integrated semiconductor memory;
actuating the control circuit in the normal operating state in synchronization with the clock signal using a fourth signal combination formed from the control signals to precharge the bit lines; and
actuating the control circuit in the normal operating state in synchronization with the clock signal using a further signal combination formed from the control signals to write a logic 0 or 1 information item to one of the memory cells.

11. The method for testing an integrated semiconductor memory as claimed in claim 1, further comprising:
changing the signal level from a first signal level to a second signal level in the first test cycle during the state change in the one of the control signals.

12. An integrated semiconductor memory, comprising:
control connections for applying control signals, at least one data connection for applying data signals, and address connections for applying address signals;
a memory cell array with memory cells comprising a selection transistor and a storage capacitor; and
a control circuit for operating the integrated semiconductor memory in synchronization with a clock signal in a normal operating state and in or out of synchronization with the clock signal in the test operating state, wherein:
the control signals, data signals, and address signals are supplied as inputs to the control circuit;
an output of the control circuit is connected to the memory cell array;
the control circuit switches the integrated semiconductor memory to a test operating state using a first signal combination formed from the control signals, the data signals and the address signals; and
respective selection transistors in the memory cells are enable in response to actuating the control circuit in a first test cycle of the test operating state using a state change in one of the control signals out of synchronization with the clock signal; and
the memory contents of at least one of the memory cells are read in synchronization with the clock signal in response to actuating the control circuit in a second test cycle of the test operating state using a second signal combination formed from the control signals.

13. The integrated semiconductor memory as claimed in claim 12, further comprising:
first sense amplifiers;
first bit line pairs connecting the first sense amplifiers to the memory cells in the memory cell array; and
a second bit line pair connected to the data connection via a second sense amplifier, wherein the first bit line pairs are connected to the second bit line pair by the first sense amplifiers respectively connected to the first bit line pairs, wherein:
the output of the control circuit is connected to control connections on the selection transistors and to control connections on the first sense amplifiers;
in the first test cycle of the test operating state, the control circuit produces a first internal control signal for turning on the selection transistors if one of the control signals has changed state from a first signal level to a second signal level; and
in the second test cycle of the test operating state, the control circuit produces a second internal control signal to cause the first sense amplifiers to connect the first bit line pair to the second bit line pair to read the memory content of one of the memory cells if the second signal combination is supplied to the input of the memory cell.

* * * * *